United States Patent [19]
Anderson et al.

[11] Patent Number: 6,155,433
[45] Date of Patent: Dec. 5, 2000

[54] DUAL PROCESSOR RETENTION MODULE

[75] Inventors: Paul H. Anderson, Aloha; Douglas G. Bennett, Beaverton; William E. Root, West Linn, all of Oreg.

[73] Assignee: Intel Corporation, Santa Clara, Calif.

[21] Appl. No.: 08/980,847

[22] Filed: Dec. 1, 1997

[51] Int. Cl.[7] .............................. H01R 13/62; A47F 7/00
[52] U.S. Cl. ........................ 211/26; 211/26; 211/41.17; 361/740; 361/801; 439/160; 439/326; 439/327
[58] Field of Search .......................... 211/26, 26.2, 41.1, 211/41.17, 41.18, 41.19, 189, 49; 361/759, 801, 756, 415, 754, 686; 439/326, 327, 328, 160, 571

[56] References Cited

U.S. PATENT DOCUMENTS

| | | | |
|---|---|---|---|
| D. 329,963 | 10/1992 | Schneider | D7/616 |
| 3,550,062 | 12/1970 | Drenten et al. | 439/160 |
| 3,559,812 | 2/1971 | Wolf | 211/49 X |
| 3,590,752 | 7/1971 | De Pew | 211/189 X |
| 3,704,394 | 11/1972 | Johnson | 439/327 X |
| 3,711,814 | 1/1973 | Pomella et al. | 317/101 X |
| 3,898,536 | 8/1975 | Wyshak et al. | 211/41.1 X |
| 3,932,016 | 1/1976 | Ammenheuser | 439/327 X |
| 4,022,326 | 5/1977 | Marconi | 211/41 |
| 4,093,076 | 6/1978 | Newton | 211/189 X |
| 4,442,991 | 4/1984 | Levens | 211/71 X |
| 4,462,499 | 7/1984 | Calabro | 211/41.1 |
| 4,537,454 | 8/1985 | Douty et al. | 339/45 |
| 4,620,265 | 10/1986 | Lerude et al. | 211/41.17 X |
| 4,691,971 | 9/1987 | Hahn | 439/78 |
| 4,713,013 | 12/1987 | Regnier et al. | 439/326 X |
| 4,756,694 | 7/1988 | Billman et al. | 439/328 X |
| 4,832,619 | 5/1989 | Eck et al. | 211/41.1 X |
| 4,850,892 | 7/1989 | Clayton et al. | 439/326 |
| 4,927,111 | 5/1990 | Takahashi | 211/41 X |
| 4,929,194 | 5/1990 | Korsunsky | 439/328 X |
| 4,990,097 | 2/1991 | Billman et al. | 439/160 |
| 5,013,264 | 5/1991 | Tondreault | 439/636 |
| 5,035,333 | 7/1991 | Klingner | 211/189 X |
| 5,064,381 | 11/1991 | Lin | 439/326 |
| 5,106,315 | 4/1992 | Billman et al. | 439/160 |
| 5,123,857 | 6/1992 | Chao | 439/326 |
| 5,147,211 | 9/1992 | Tondreault et al. | 439/160 |
| 5,174,778 | 12/1992 | Lin | 439/326 |
| 5,176,531 | 1/1993 | Lin | 439/326 |
| 5,216,578 | 6/1993 | Zenitani et al. | 211/41.1 X |
| 5,283,713 | 2/1994 | Nagafuji et al. | 211/41.1 X |
| 5,370,245 | 12/1994 | Tersch et al. | 211/74 |
| 5,404,275 | 4/1995 | Zeitani et al. | 361/801 X |
| 5,417,580 | 5/1995 | Tsai | 439/328 |
| 5,490,792 | 2/1996 | Sugita | 439/159 |
| 5,514,002 | 5/1996 | Chen et al. | 439/326 |
| 5,642,263 | 6/1997 | Lauruhn | 211/211 |
| 5,650,917 | 7/1997 | Hsu | 361/759 |
| 5,708,552 | 1/1998 | Han et al. | 361/756 X |
| 5,726,856 | 3/1998 | Webb et al. | . |
| 5,751,556 | 5/1998 | Butler et al. | 361/756 X |
| 5,801,928 | 9/1998 | Burstedt et al. | 361/801 |
| 5,822,197 | 10/1998 | Thuault | 361/801 X |
| 5,829,601 | 11/1998 | Yurchenco et al. | 211/41.17 |
| 5,842,880 | 12/1998 | Pei | 439/327 |
| 5,885,097 | 3/1999 | Chen | 439/328 |
| 5,889,656 | 3/1999 | Yin | 361/801 |
| 5,902,143 | 5/1999 | Pan et al. | 439/327 |

*Primary Examiner*—Daniel P. Stodola
*Assistant Examiner*—Khoa Tran
*Attorney, Agent, or Firm*—Kenyon & Kenyon

[57] ABSTRACT

A dual processor retention module for holding one or two edge connector processors. The dual processor retention module includes a first and second retention slot. Each retention slot includes a first and second horizontal bar, with each bar having a first end and a second end. Each retention slot also includes a first upright member connected to the first ends of the first and second horizontal bars, and a second upright member connected to the second ends of the first and second horizontal bars. The dual processor retention module has a first pair of connectors connecting the first upright members, and a second pair of connectors connecting the second upright members. The connectors are placed such that the horizontal bars for the first retention slot are parallel to the horizontal bars for the second retention slot.

12 Claims, 5 Drawing Sheets ated every 12 months. This is
DUAL PROCESSOR RETENTION MODULE

FIELD OF THE INVENTION

The invention relates to retention modules in general. More particularly, the invention relates to a retention module to provide support, retention and protection of one or two processors.

BACKGROUND OF THE INVENTION

Designs in processor architecture are accelerating at an extraordinary pace. According to "Moore's Law" computer technology can become outdated every 12 months. This is especially true in the area of processor design where users desire more powerful software applications, thus requiring more powerful processors.

One important factor in processor design is the "footprint" of the processor. The term "footprint" refers to how much space the processor requires to mount the processor to a printed circuit board, such as a mother board for a computer. The mother board typically holds the critical components of a computer, such as the processor, co-processors, high-speed memory, cache memory, and so forth. The larger the footprint of the processor, the less room there is for other critical components. This leads to either larger mother boards, which increases the overall size of a computer, or significant costs in reducing the size of each component placed on the mother board. The latter case would, of course, mean an increase in the overall cost of a computer. Therefore, efficient use of space on a mother board is an important design parameter in the construction of computers.

Earlier generations of processors were typically shaped in the form of a thin square, with pin connectors positioned on the edges of the square. The pin connectors were used to transfer electrical signals to and from the mother board and the processor. To operate, the pin connectors had to make contact with corresponding metallic leads on the mother board. Since the pins were positioned around the edges of the square processor, the processor had to be placed horizontally to the mother board to ensure proper contact between the pin connectors of the processor and the leads on the mother board.

The horizontal placement of the processor to the mother board was less than satisfactory for a number of reasons. For example, the horizontal placement of the processor required a relatively large footprint, thereby consuming space on the mother board. In addition, the horizontal placement made it difficult for a person to physically add or remove a processor to or from the mother board. Moreover, a new generation of processors requires large amounts of power to operate efficiently, and therefore requires relatively large heat sinks to keep the processor from over heating. The horizontal placement of the processing chip on the mother board made the addition of a heat sink cumbersome and less efficient.

In an attempt to solve the above-mentioned problems, a processor with an edge connector (e.g., a single edge connector cartridge (SECC) processor) was developed. SECC processors have the pin connectors mounted on only one side of a cartridge holding the processor. The SECC processor can thus be mounted with the larger area of the cartridge perpendicular or vertical to the mother board. By mounting the SECC processor vertically to the mother board, the SECC processor has a smaller footprint and makes room for additional components on the mother board. The vertical placement also allows the addition of a heat sink to the SECC processor. One example of an SECC processor having a heat sink is the Pentium® II processor made by Intel Corporation.

Although the SECC processor solved one set of problems, a new set of problems developed. For example, the SECC processor had a smaller footprint which meant precautions were necessary to prevent the SECC processor from becoming disconnected from the mother board. Disconnection could occur for any number of reasons, such as shock or vibration during transport. Moreover, the disconnect problem was augmented for SECC processors having external heat sinks mounted to the cartridge, such as the Pentium® II processor. The overall weight of the SECC processor can amount to approximately one pound with the addition of a heat sink. The weight of the SECC processor means that movement of the SECC processor could easily disconnect the SECC processor from the mother board, and in extreme situations, shatter the relatively fragile structure of the mother board.

In view of the foregoing, it can be appreciated that a substantial need exists for a structure to hold an edge connector processor to ensure that the processor remains stable.

SUMMARY OF THE INVENTION

The present invention includes a dual processor retention module for holding one or two edge connector processors. The dual processor retention module includes a first and second retention slot. Each retention slot includes a first and second horizontal bar, with each bar having a first end and a second end. Each retention slot also includes a first upright member connected to the first ends of the first and second horizontal bars, and a second upright member connected to the second ends of the first and second horizontal bars. The dual processor retention module has a first pair of connectors connecting the first upright members, and a second pair of connectors connecting the second upright members. The connectors are placed such that the horizontal bars for the first retention slot are parallel to the horizontal bars for the second retention slot.

DETAILED DESCRIPTION

Figure 1:
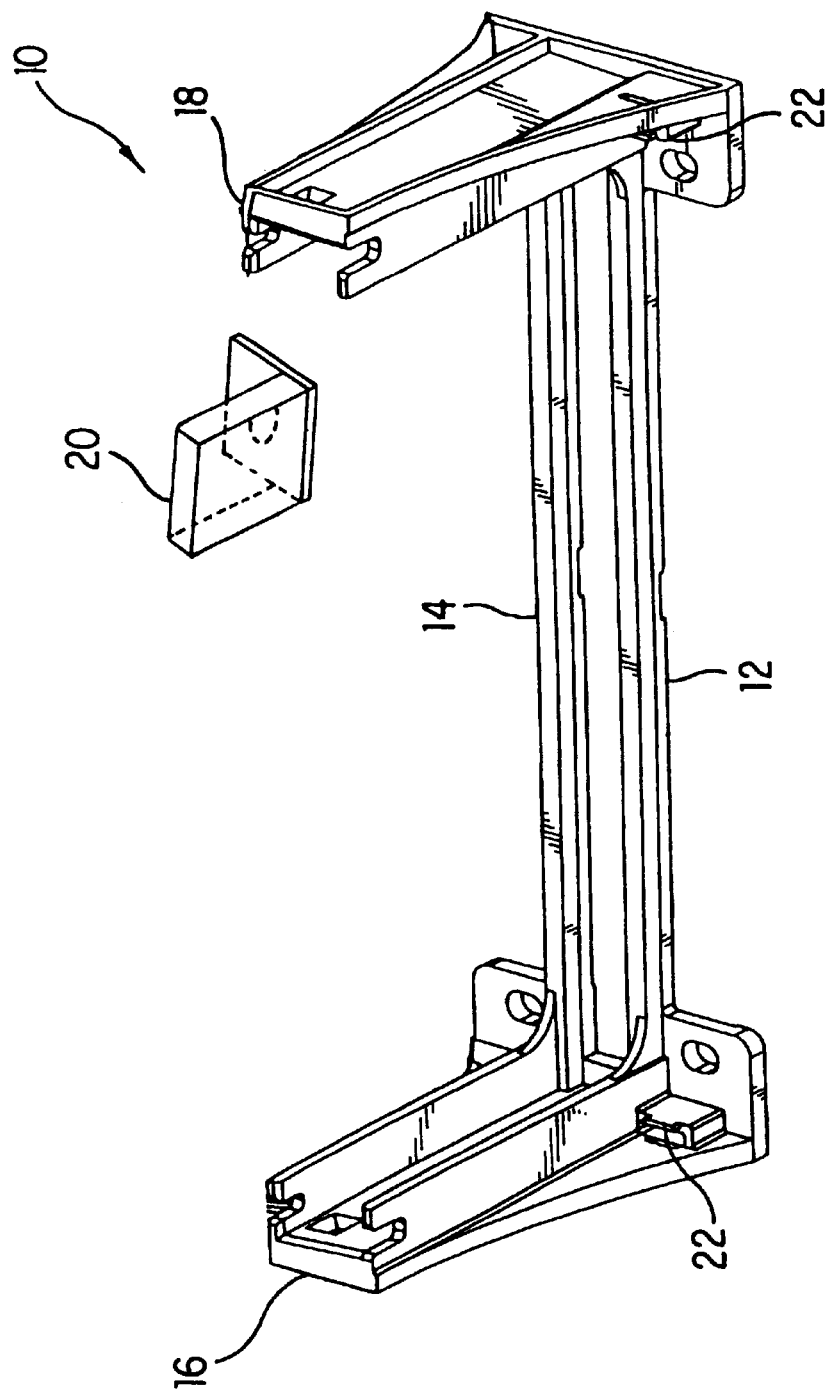
FIG. 1 is a perspective view of a retention module for supporting an edge connector processor.

An example of a retention module for an edge connector processor is illustrated in FIG. 1. As shown in FIG. 1, a retention module 10 includes a pair of horizontal bars 12 and 14, respectively. Retention module 10 also includes a first upright member 16 attached to one end of horizontal bars 12 and 14, and a second upright member 18 connected to the opposite end of horizontal bars 12 and 14. Upright members 16 and 18 each form a slot for receiving one end of a processor, such as the Pentium® II processor. Although not indicated in the drawings, the approximate material thickness of horizontal bars 12 and 14, and upright members 16 and 18, is 2 mm. Also shown in FIG. 1, is a heat sink supporting member 20 that is separate from retention module 10, but used in conjunction with retention module 10. As can also be seen from FIG. 1, the bottom sections of upright members 16 and 18 include fastening holes for receiving a fastening device in order to secure retention module 10 to a printed circuit board, e.g., a mother board for a computer (not shown). Located adjacent to these fastening holes, are mounting blocks 22. Mounting blocks 22 are designed to assist in the fastening of a retention module 10 to the mother board.

A retention module such as the one illustrated in FIG. 1, has several limitations. For example, the retention module of FIG. 1 is designed to house a single processor. Many modern computers, especially servers, are increasingly being designed for use with two or more processors. Thus, each processor requires a separate retention module to hold it vertically in place. The use of multiple retention modules, however, requires a large footprint, thereby taking up valuable space on the board. Another example of a limitation of the retention module of FIG. 1 is that each individual retention module requires a separate component external to the main structure to help support the heat sinks for modern day processors such as the Pentium® II processor. This additional structure once again consumes valuable space on the board, and increases the costs associated with this retention module. A third example of the inefficiencies of the retention module of FIG. 1 is that it is made of plastic having a material thickness of approximately 2 millimeters (mm). The manufacture of a retention module can be performed by injecting the plastic into a single point in the mold, with the intention that the plastic would fill the entire mold prior to cooling. The retention module of FIG. 1, however, can be so thin that often times the plastic cools before the mold is filled, thus leading to a high number of defective products. A final example of the deficiencies of the retention module of FIG. 1 is that each, along with the separate component for supporting the heat sink for a processor, requires eleven fastening parts for each processor. Consequently, if a computer required two processors, two retention modules with twenty-two fastening parts would be required, thereby increasing the overall cost of a computer or server.

The dual processor retention module constructed according to an embodiment of the present invention solves the problems caused by the processor retention module of FIG. 1. For example, the dual processor retention module can hold up to two SECC processors while maintaining a footprint that is smaller than two single processor retention modules used separately, and yet strong enough to prevent the module from becoming disconnected from a mother board due to vibrations or shock events. Further, the dual processor retention module eliminates the need for two separate components external (one for each single processor retention module) to the main structure to help support the heat sinks for multiple SECC processors. In addition, the dual processor retention module has a material thickness of approximately 3 mm thick, thereby resolving the premature cooling occurring in the manufacture of the single processor retention module. Moreover, the dual processor retention module requires as few as four fastening parts (e.g., screws) to secure the module to a mother board, while the single processor retention module requires eleven fastening parts per module, which for two modules necessitates twenty-two separate fastening parts.

Figure 2:
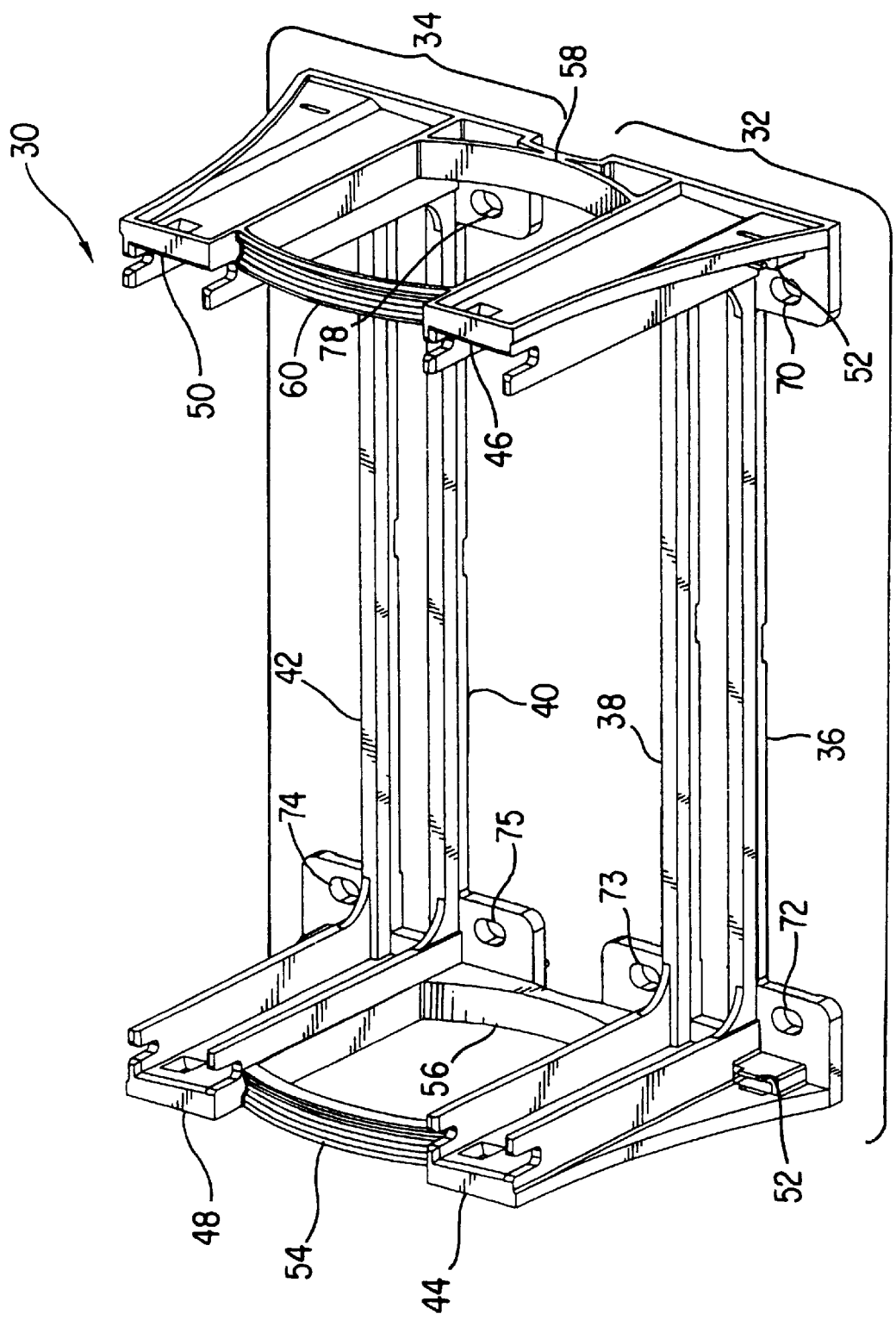
FIG. 2 is a perspective view of a dual processor retention module in accordance with one embodiment of the invention.

Referring to FIG. 2, a perspective view of a dual processor retention module in accordance with one embodiment of the invention is shown. As shown in FIG. 2, a dual processor retention module 30 includes a first and second retention module slot, labeled as 32 and 34, respectively.

Retention module slot 32 includes a first horizontal bar 36 and a second horizontal bar 38, with each bar having a first end and a second end. Retention module slot 32 also includes a first upright member 44 connected to the first ends of the first and second horizontal bars 36 and 38, and a second upright member 46 connected to the second ends of first and second horizontal bars 36 and 38.

Retention module slot 34 includes a first horizontal bar 40 and a second horizontal bar 42. Retention module slot 34 also includes a first upright member 48 connected to the first ends of the first and second horizontal bars 40 and 42, and a second upright member 50 connected to the second ends of first and second horizontal bars 40 and 42.

Upright members 44 and 46 each form a slot to hold one end of a first processor. Upright members 48 and 50 each form a slot to hold one end of a second processor. In an embodiment of the invention, the first and second processors may be Pentium® II processors.

Figure 3:
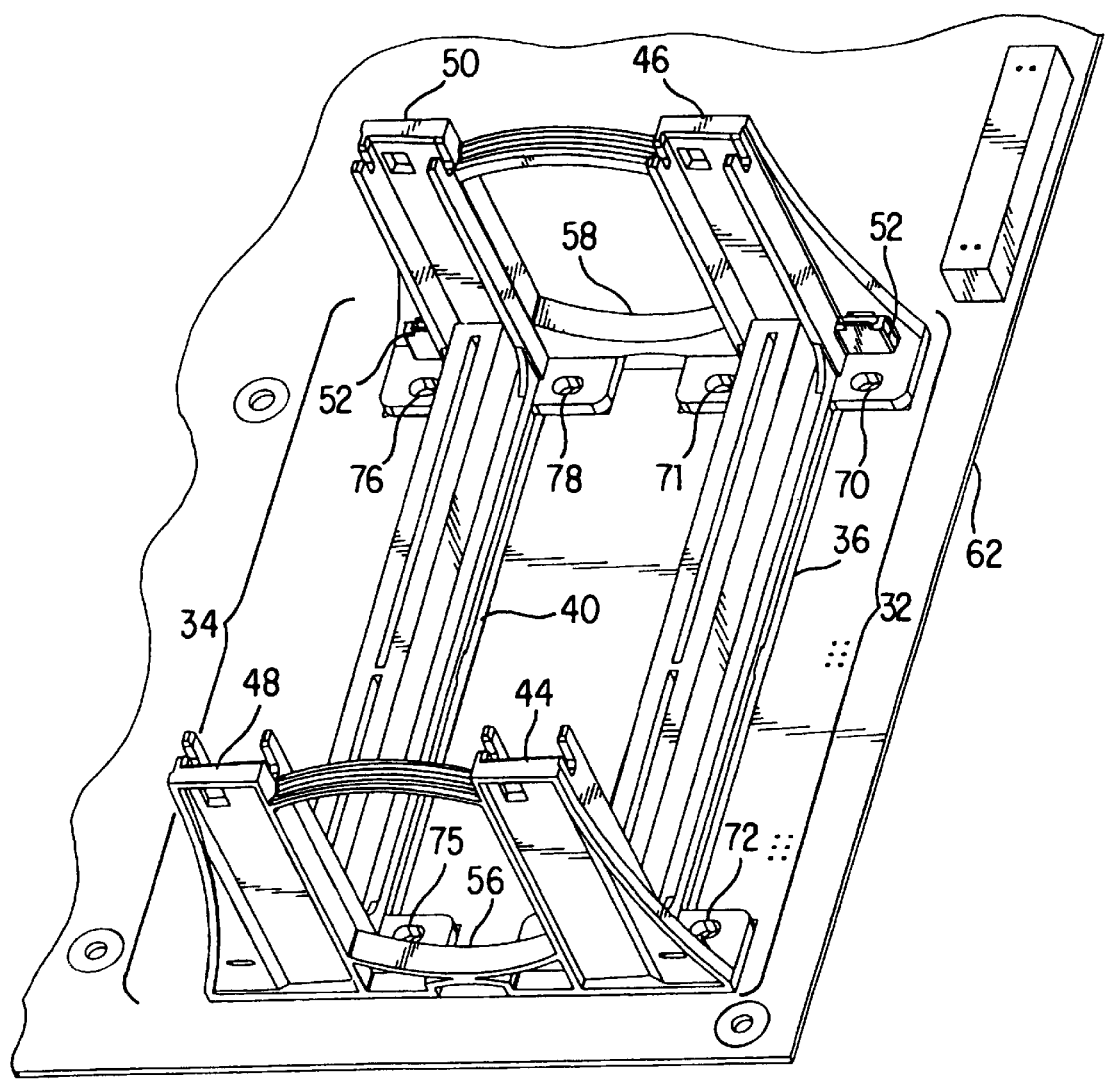
FIG. 3 is a perspective view of a dual processor retention module connected to a mother board in accordance with one embodiment of the invention.

Both retention module slot 32 and 34 include mounting blocks 52 (mounting blocks 52 are shown in FIG. 3 for retention module slot 34). Further, retention module slot. 32 includes fastening holes 70, 71, 72 and 73, and retention module slot 34 includes fastening holes 74, 75, 76 and 78 (fastening holes 71 and 76 are shown in FIG. 3).

Dual processor retention module 30 includes a first pair of connectors, such as connecting bars 54 and 56, respectively, connecting first upright members 44 and 48. Dual processor module 30 also includes a second pair of connectors, such as connecting bars 58 and 60, respectively, connecting second upright members 46 and 50. Connecting bars 54, 56, 58 and 60 are placed such that horizontal bars 36 and 38 are substantially parallel to horizontal bars 40 and 42.

FIG. 3 is a perspective view of a dual processor retention module connected to a mother board in accordance with one embodiment of the invention. As shown in FIG. 3, dual processor retention module 30 is affixed to a mother board 62. The configuration of dual processor retention module 30 permits module 30 to hold up to two SECC processors while minimizing the amount of space required to secure the SECC processors to the mother board. At the bottom of each upright member is a fastening hole for receiving a fastener for mounting dual processor retention module 30 to mother board 62. Dual processor retention module 30 can be fastened to mother board 62 utilizing a minimum of four screws inserted through fastening holes 70, 72, 74 and 76, respectively. To provide a stronger connection to mother board 62, an additional four screws can be inserted through fastening holes 71, 73, 75 and 78, respectively. In this embodiment of the invention, the screws are #6–32 screws. It can be appreciated, however, that any type of means for fastening dual processor module 30 securely to mother board 62 falls within the scope of the invention.

Figure 4:
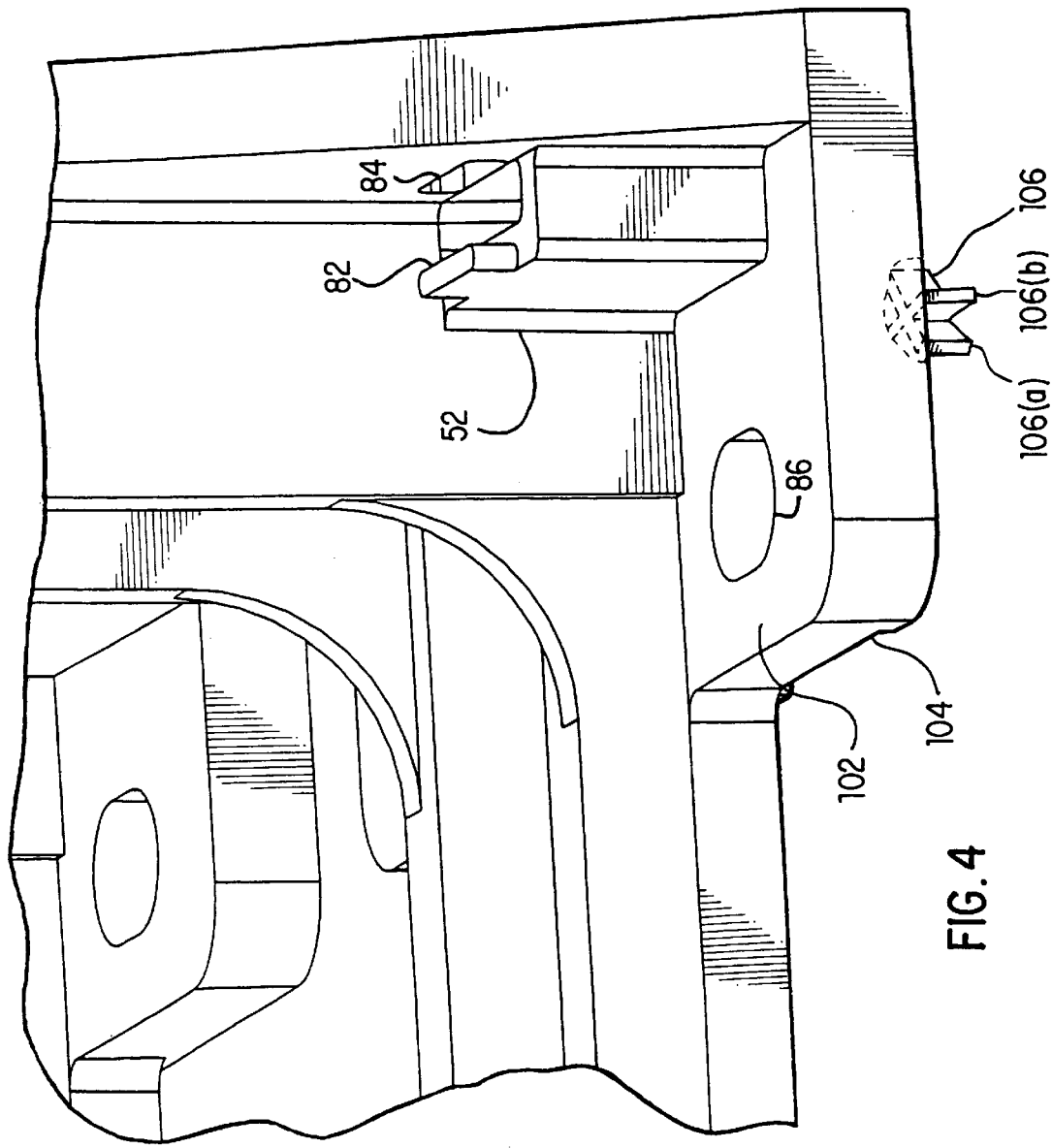
FIG. 4 is a perspective view of a mounting block and fastening hole in accordance with one embodiment of the invention.

FIG. 4 is a perspective view of a mounting block and fastening hole in accordance with one embodiment of the invention. FIG. 4 also illustrates a fastening hole 86 which is representative of fastening holes 70, 71, 72, 73, 74, 75, 76 and 78.

As shown in FIG. 4, mounting block 52 is positioned at the outside corner of the bottom of each upright member. Each bottom for each upright member includes a top edge 102 and a bottom edge 104. Mounting block 52 includes a positioning stud 82 and a fastener stabilizing hole 84. As discussed with reference to FIG. 3, dual processor retention module 30 can be mounted to mother board 62 by inserting a screw (not shown) through fastening hole 86. Dual processor retention module 30, however, can also be fastened to mother board 62 using conventional fastening techniques. For example, the retention module of FIG. 1 can utilize threaded brass studs, brass nuts and a stainless steel fastening clip to fasten it to a mother board. A mounting block is used to hold the stainless steel clip in place. The addition of mounting block 52 to dual processor retention module 30 permits the same fastening configuration used by the retention module of FIG. 1 to be used with dual processor retention module 30 and still fall within the scope of the invention.

Figure 5:
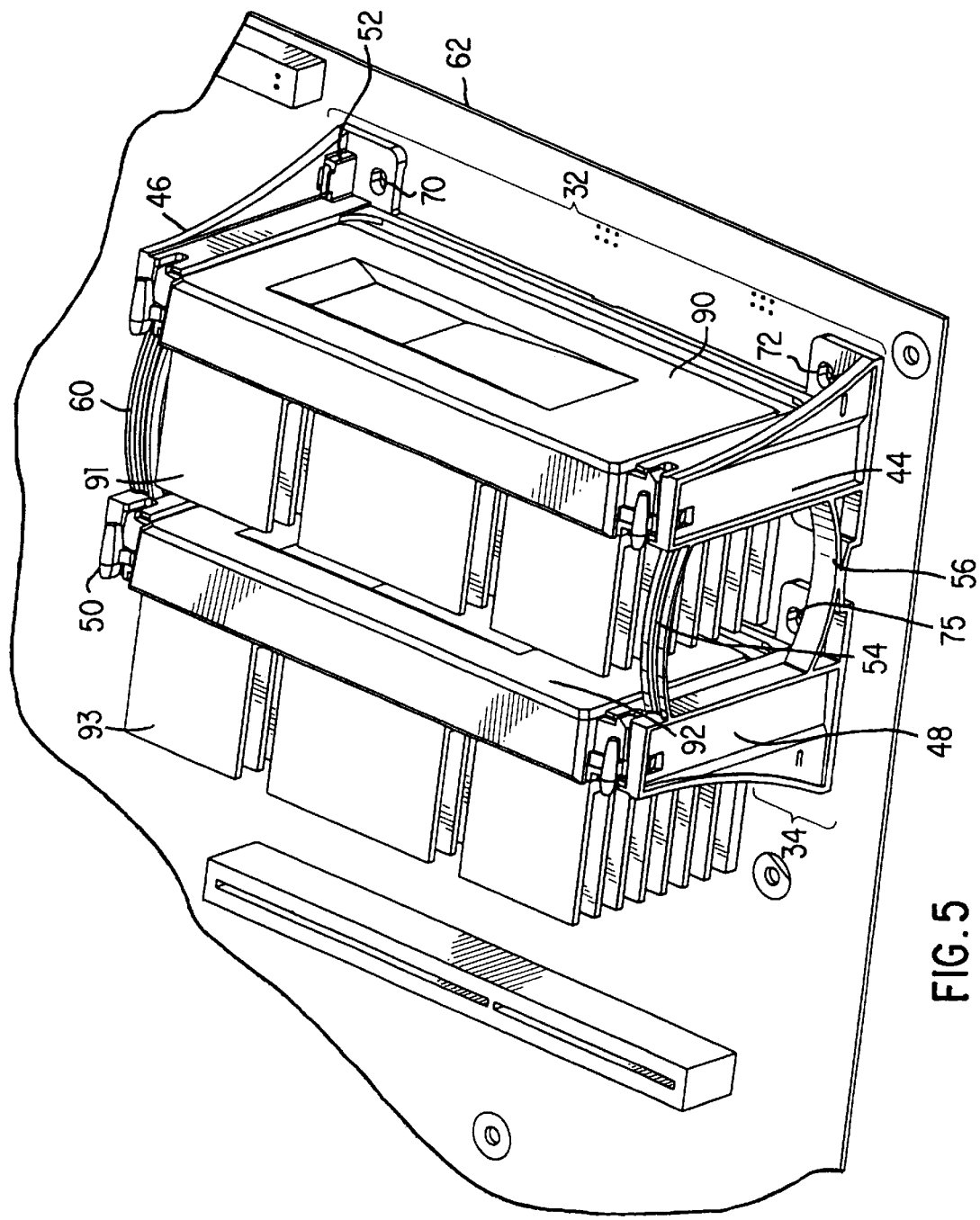
FIG. 5 is a perspective view of a dual processor retention module holding two processors in accordance with one embodiment of the invention.

FIG. 5 is a perspective view of a dual processor retention module holding two processors in accordance with one embodiment of the invention. As shown in FIG. 5, dual processor retention module 30 is mounted to mother board 62. A first processor 90 having a heat sink 91 is inserted into retention module slot 32, and processor 90 is held in place at one end by upright member 44, and at the other end of processor 90 by upright member 46. Processor 90 is also inserted into retention module slot 32 with heat sink 91 having connecting bars 54 and 56 at one end of heat sink 91, and connecting bar 58 (not shown in FIG. 5) and connecting bar 60 at the other end of heat sink 91. Connecting bars 54, 56, 58 and 60 are positioned to securely hold retention module slot 32 and retention module slot 34 together, and still leave sufficient space to allow heat to properly dissipate from heat sink 91. A second processor 92 having a heat sink 93 is inserted into retention module slot 34, and processor 92 is held in place at one end by upright member 48, and at the other end of processor 92 by upright member 50. Processor 92 is inserted into retention module slot 34 with heat sink 93 not having any substantial structure from dual processor retention module 30 on either side of heat sink 93.

In another embodiment of the invention, dual processor retention module 30 is equipped with guide studs located on the bottoms of upright members 44, 46, 48 and 50. The guide studs match indentations placed into mother board 62, which represent the proper position for dual processor retention module 30 to be fastened to mother board 62. Consequently, when dual processor retention module 30 is in the process of being secured to mother board 62, the guide studs are inserted into the matching indentations to ensure that dual processor retention module 30 is secured to mother board 62 where the mother board designer desires module 30 to be placed. In this embodiment of the invention, each guide stud 106 comprises a pair of crossed bars 106(a) and 106(b) raised from the bottom edge 104 of each upright members 44, 46, 48 and 50, as shown in FIG. 4.

In yet another embodiment of the invention, a dual processor retention module is substantially identical to dual processor retention module 30, but does not have mounting blocks 52. This minimizes the amount of plastic required to form this embodiment of the dual processor retention module, as well as mold complexity, thus decreasing manufacturing costs and the number of production defects.

Although various embodiments are specifically illustrated and described herein, it will be appreciated that modifications and variations of the present invention are covered by the above teachings and within the purview of the appended claims without departing from the spirit and intended scope of the invention. For example, although cross bars 54, 56, 58 and 60 are used to attach retention module slot 32 with retention module slot 34, any number of structures connecting slots 32 and 34 with sufficient strength to hold slots 32 and 34 rigid enough to support two SECC processors, and leaving sufficient space to allow heat sink 91 to properly dissipate heat, falls within the scope of the invention. For example, a cross-work lattice could be used in place of connecting bars 54, 56, 58 and 60.

What is claimed is:

1. A dual processor retention module comprising:
   a first and second retention slot, with each slot adapted to receive at least one edge connector processor, and with each slot being defined by:
   a first and second horizontal bar, with each bar having a first end and a second end;
   a first upright member homogeneously formed with said first ends of said first and second horizontal bars;
   a second upright member homogeneously formed with said second ends of said first and second horizontal bars;
   a first pair of connectors connecting said first upright members, and a second pair of connectors connecting said second upright members, said connectors vertically spaced such that said horizontal bars for said first retention slot are parallel to said horizontal bars for said second retention slot.

2. The retention module of claim 1, wherein each slot is adapted to receive a single edge connector cartridge processor.

3. The retention module of claim 2 wherein said first and second pairs of connectors are connecting bars.

4. The retention module of claim 3, wherein said first and second upright members have a top end and bottom end, with each bottom end having a pair of fastening holes for receiving a fastener.

5. The retention module of claim 4, further comprising a mounting block placed within six centimeters of said fastening holes.

6. The retention module of claim 5, wherein said bottom end of said first and second upright members have a top edge and bottom edge, and further comprising a guide stud placed on said bottom edge of each upright member.

7. The retention module of claim 6, wherein each guide stud comprises a pair of crossed bars raised from said bottom edge.

8. The retention module of claim 7, wherein said horizontal bars, upright members, and connectors, are at least three millimeters thick.

9. The retention module of claim 8, wherein said upright members are configured to receive one end of said edge connector processor.

10. The retention module of claim 9, wherein a length for said connectors is equal to or greater than a length for a heat sink for said edge connector processor.

11. The retention module of claim 4, wherein said fastener is a screw, with said screw passing through each fastening hole for securing said retention slots to a mother board.

12. The retention module of claim 4, wherein each fastener is a fastening clip.

* * * * *

UNITED STATES PATENT AND TRADEMARK OFFICE
CERTIFICATE OF CORRECTION

PATENT NO.   : 6,155,433   Page 1 of 1
DATED        : December 5, 2000
INVENTOR(S)  : Paul H. Anderson; Douglas G. Bennett; William E. Root It is certified that error appears in the above-identified patent and that said Letters Patent is hereby corrected as shown below:

Column 1,
Line 12, "12" should be -- 18 --

Column 3,
Line 50, "yet strong" should be -- yet be strong --

Column 34,
Line 22, "slot" should be -- slots --
Line 25, "slot." should be -- slot --

Signed and Sealed this

Eighteenth Day of December, 2001

Attest:

JAMES E. ROGAN
Attesting Officer        Director of the United States Patent and Trademark Office